United States Patent
Konrath et al.

(10) Patent No.: US 10,763,339 B2
(45) Date of Patent: Sep. 1, 2020

(54) METHOD FOR MANUFACTURING A SEMICONDUCTOR DEVICE HAVING A SCHOTTKY CONTACT

(71) Applicant: Infineon Technologies Austria AG, Villach (AT)

(72) Inventors: Jens Peter Konrath, Villach (AT); Ronny Kern, Finkenstein (AT); Stefan Krivec, Arnoldstein (AT); Ulrich Schmid, Vienna (AT); Laura Stoeber, Vienna (AT)

(73) Assignee: Infineon Technologies Austria AG, Villach (AT)

( * ) Notice: Subject to any disclaimer, the term of this patent is extended or adjusted under 35 U.S.C. 154(b) by 41 days.

(21) Appl. No.: 15/040,353

(22) Filed: Feb. 10, 2016

(65) Prior Publication Data

US 2016/0276452 A1  Sep. 22, 2016

(30) Foreign Application Priority Data

Feb. 11, 2015 (DE) ......... 10 2015 101 966

(51) Int. Cl.
*H01L 29/872* (2006.01)
*H01L 29/47* (2006.01)
(Continued)

(52) U.S. Cl.
CPC ...... *H01L 29/475* (2013.01); *H01L 21/02068* (2013.01); *H01L 21/02592* (2013.01);
(Continued)

(58) Field of Classification Search
None
See application file for complete search history.

(56) References Cited

U.S. PATENT DOCUMENTS 3,636,417 A * 1/1972 Kimura ............... B29C 35/02
257/483
4,680,601 A  7/1987 Mitlehner et al.
(Continued)

FOREIGN PATENT DOCUMENTS

DE   3219606 A1   12/1983
JP   S59124765 A   7/1984
(Continued)

OTHER PUBLICATIONS

Islam, Md M., et al., "Effects of Surface/Interface States on Schottky Contacts for 4H-SiC", Proceedings of the Thirty-Seventh Southeastern Symposium on System Theory, Mar. 20-22, 2005, 378-382.
(Continued)

*Primary Examiner* — Ali Naraghi
(74) *Attorney, Agent, or Firm* — Murphy, Bilak & Homiller, PLLC

(57) ABSTRACT

A semiconductor device includes an n-doped monocrystalline semiconductor substrate having a substrate surface, an amorphous n-doped semiconductor surface layer at the substrate surface of the n-doped monocrystalline semiconductor substrate, and a Schottky-junction forming material in contact with the amorphous n-doped semiconductor surface layer. The Schottky-junction forming material forms at least one Schottky contact with the amorphous n-doped semiconductor surface layer.

18 Claims, 6 Drawing Sheets

(51) Int. Cl.
*H01L 21/302* (2006.01)
*H01L 21/3065* (2006.01)
*H01L 29/06* (2006.01)
*H01L 29/40* (2006.01)
*H01L 29/66* (2006.01)
*H01L 21/02* (2006.01)
*H01L 21/285* (2006.01)
*H01L 29/16* (2006.01)
*H01L 29/161* (2006.01)
*H01L 21/04* (2006.01)
*H01L 29/20* (2006.01)

(52) U.S. Cl.
CPC .. *H01L 21/28537* (2013.01); *H01L 21/28581* (2013.01); *H01L 21/302* (2013.01); *H01L 21/3065* (2013.01); *H01L 29/0619* (2013.01); *H01L 29/161* (2013.01); *H01L 29/1602* (2013.01); *H01L 29/401* (2013.01); *H01L 29/47* (2013.01); *H01L 29/6606* (2013.01); *H01L 29/872* (2013.01); *H01L 21/0495* (2013.01); *H01L 29/1608* (2013.01); *H01L 29/2003* (2013.01)

(56) References Cited

U.S. PATENT DOCUMENTS

| | | | |
|---|---|---|---|
| 6,501,145 | B1 | 12/2002 | Kaminski et al. |
| 6,878,921 | B2* | 4/2005 | Taguchi ............... H01L 31/0747 136/258 |
| 6,905,916 | B2 | 6/2005 | Bartsch et al. |
| 2004/0266142 | A1* | 12/2004 | Tillack ................ C23C 16/0218 438/478 |
| 2010/0310773 | A1* | 12/2010 | Yoshida ............... B29C 33/3842 427/304 |
| 2011/0220918 | A1* | 9/2011 | Sugai .................... H01L 29/872 257/77 |
| 2012/0001178 | A1 | 1/2012 | Miyairi et al. |
| 2014/0087292 | A1* | 3/2014 | Hashimoto ............... G03F 1/54 430/5 |
| 2014/0097153 | A1* | 4/2014 | Ashraf ................ H01L 21/3081 216/51 |
| 2014/0227527 | A1* | 8/2014 | Brors ...................... F27B 14/10 428/411.1 |
| 2015/0040822 | A1* | 2/2015 | Olsen .................... C30B 25/186 117/97 |

FOREIGN PATENT DOCUMENTS

| | | |
|---|---|---|
| JP | S6025275 A | 2/1985 |
| JP | S60261177 A | 12/1985 |
| JP | S61296754 A | 12/1986 |
| JP | S6450527 A | 2/1989 |
| JP | H03295229 A | 12/1991 |
| JP | H0480962 A | 3/1992 |
| JP | H08195403 A | 7/1996 |
| JP | H0964381 A | 3/1997 |
| JP | 2002299642 A | 10/2002 |
| JP | 2004055586 A | 2/2004 |
| JP | 2006302999 A | 11/2006 |
| JP | 2008034646 A | 2/2008 |
| JP | 2008042198 A | 2/2008 |
| JP | 2008130874 A | 6/2008 |
| JP | 2009081177 A | 4/2009 |
| JP | 2009194081 A | 8/2009 |
| JP | 2012069798 A | 4/2012 |
| JP | 2013038319 A | 2/2013 |
| JP | 2013161805 A | 8/2013 |
| JP | 2013251406 A | 12/2013 |

OTHER PUBLICATIONS

Morrison, D J, et al., "Surface preparation for Schottky metal—4H-SiC contacts formed on plasma-etched SiC", Semiconductor Science and Technology, vol. 15, Sep. 19, 200, 1107-1114.

* cited by examiner

METHOD FOR MANUFACTURING A SEMICONDUCTOR DEVICE HAVING A SCHOTTKY CONTACT

PRIORITY CLAIM

This application claims priority to German Patent Application No. 10 2015 101 966.3 filed on 11 Feb. 2015, the content of the application incorporated herein by reference in its entirety.

TECHNICAL FIELD

Embodiments described herein relate to methods for manufacturing semiconductor devices having a Schottky contact and to semiconductor devices having an amorphous semiconductor surface layer between the monocrystalline semiconductor body and a Schottky barrier forming metal.

BACKGROUND

Schottky junctions are used for fast switching power devices due to their low losses and high switching speed. The barrier height of a Schottky junction depends on the semiconductor material and the metal used to form the Schottky junction with the semiconductor material. In addition to that, surface defects and other surface characteristics influence the quality of the Schottky junctions and may shift the barrier height. However, well defined Schottky junctions are needed, particularly for power devices.

To reduce the variation of the Schottky barrier height, the surface of the semiconductor substrate is commonly subjected to a dry-chemical RIE process (reactive ion etching) to saturate the surface with fluorine which is referred to as fluorine covering. However, the fluorine covering is only suitable in combination with a subsequent vapour deposition of a Schottky barrier forming metal. Furthermore, the fluorine covering does not appear to be stable enough.

In view of the above, there is a need for improvement.

SUMMARY

According to an embodiment, a method for manufacturing a semiconductor device having at least one Schottky contact includes: providing a semiconductor substrate having a substrate surface; pre-treating the semiconductor substrate by subjecting the substrate surface to a capacitively coupled plasma, wherein the power, which is capacitively coupled into the plasma, is in a range from 0 W to 80 W, in particular in a range between 5 W and 60 W, and more particularly in a range between 5 W and 40 W; and sputtering a Schottky-junction forming material onto the pre-treated substrate surface to form a Schottky contact between the Schottky-junction forming material and the semiconductor substrate.

According to an embodiment, a method for manufacturing a semiconductor device having at least one Schottky contact includes: providing a semiconductor substrate having a substrate surface; pre-treating the semiconductor substrate by subjecting the substrate surface to a capacitively coupled plasma for less than 120 s at a pressure of less than 0.11 Pa (0.8 mTorr) and particularly between 0.0133 Pa (0.1 mTorr) and 0.11 Pa (0.8 mTorr); and sputtering a Schottky-junction forming material onto the pre-treated substrate surface to form a Schottky contact.

According to an embodiment, a semiconductor wafer includes an n-doped semiconductor wafer having a wafer surface; and a plurality of Schottky contacts formed at the wafer surface, wherein each of the Schottky contacts having a Schottky barrier height. The standard variation of the Schottky barrier heights of the Schottky contacts is less than 5%, particularly less than 2%, and more particularly less than 1% of the arithmetically mean Schottky barrier height of the plurality of the Schottky barrier heights of the Schottky contacts.

According to an embodiment, a semiconductor device includes an n-doped monocrystalline semiconductor substrate having a substrate surface; an amorphous n-doped semiconductor surface layer at the substrate surface of the n-doped monocrystalline semiconductor substrate; and a Schottky-junction forming material in contact with the amorphous n-doped semiconductor surface layer. The Schottky-junction forming material forms at least one Schottky contact with the amorphous n-doped semiconductor surface layer.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings.

DETAILED DESCRIPTION

Figure 1:
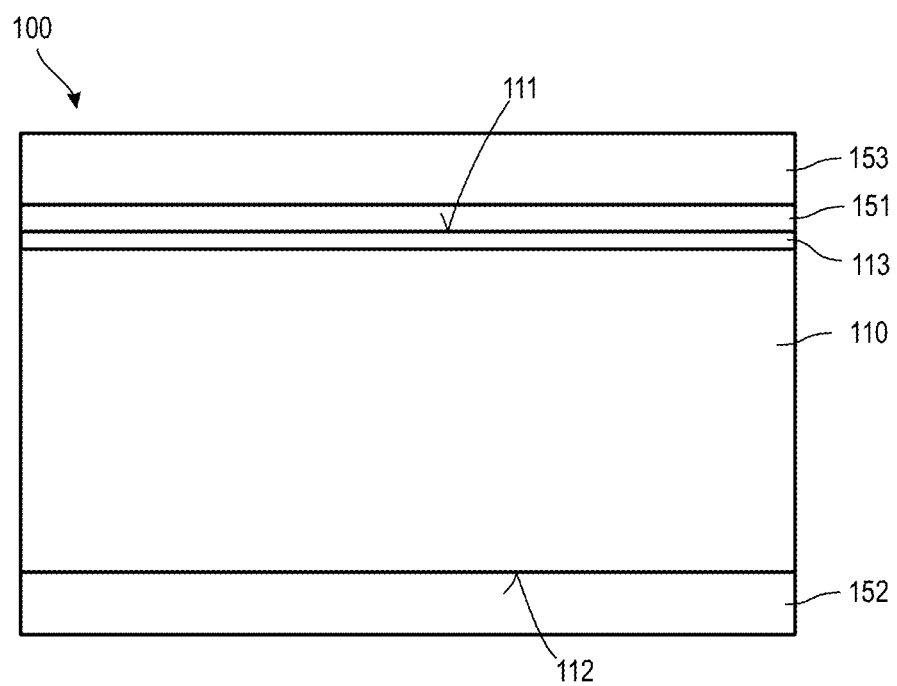
FIG. 1 illustrates a semiconductor device having a Schottky junction according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second side or surface of a semiconductor substrate is considered to be formed by the lower or back-side side or surface while a first side or surface is considered to be formed by the upper, front or main side or surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

An embodiment is described next with reference to FIG. 1. A semiconductor device 100 includes a monocrystalline semiconductor substrate 110 with a substrate surface 111 which is also referred to as first surface or first side. The semiconductor substrate 110 has a second surface or side 112 arranged opposite the first surface 111. The semiconductor substrate 110 can be, for example, n-doped.

The semiconductor substrate 110 can be made of any semiconductor material suitable for manufacturing semiconductor components and particularly suitable for manufacturing Schottky diodes. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material.

According to an embodiment, the semiconductor substrate 110 includes SiC, Si, SiGe, GaAs, GaN, AlGaAs, GaInP, III-V compound semiconductors such as GaAsP, (III,III)-V compound semiconductors, III-(V,V) compound semiconductors, or diamond. For power semiconductor applications currently mainly Si, SiC and GaN materials are used.

An amorphous semiconductor surface layer 113 is formed at or on the substrate surface 111 of the monocrystalline semiconductor substrate 110. The amorphous semiconductor surface layer 113 has the same conductivity type as the semiconductor substrate 110 and can be, for example, n-doped. The amorphous semiconductor surface layer 113 is comparably thin and can have a thickness, according to an embodiment, in a range between about 2 nm and about 8 nm. According to an embodiment, the thickness is in a range between about 3 nm and about 7 nm. The presence and thickness of the amorphous semiconductor surface layer 113 can be determined, for example, using a focused ion beam cut in combination with scanning electron microscope analyses.

A Schottky-junction forming material 151 is on and in physical contact with the amorphous semiconductor surface layer 113. The Schottky-junction forming material 151 forms at least one, typically a plurality of, separate and distinct Schottky contacts with the amorphous semiconductor surface layer 113. Each Schottky contact forms a Schottky diode according to an embodiment.

FIG. 1 further illustrates an optional first metallization layer 153 on and in contact with the Schottky-junction forming material 151. The first metallization layer 153 forms together with the Schottky-junction forming material 151 an anode metallization.

The Schottky-junction forming material 151 can be selected from any of molybdenum, molybdenum nitride, titanium, titanium nitride, tantalum, tantalum nitride, tungsten, tungsten nitride, polysilicon having a doping concentration of at least $10^{17}/cm^3$, and any combinations thereof. Molybdenum and molybdenum nitride provide Schottky contacts with low barrier height which are beneficial in view of power losses and switching speed. Molybdenum nitride can be of the general form of $Mo_xN_y$. Furthermore, titanium or titanium nitride can also beneficially be used as Schottky-junction forming material 151. Generally, a low barrier height is desirable as this reduces power losses during on state and switching of the semiconductor device 100 having Schottky diodes.

The Schottky barrier height of the Schottky contact or Schottky junction is well defined using the methodology as further explained in detail below. Briefly, due to a surface treatment, which is referred to as pre-treating, before deposition of the Schottky-junction forming material 151 the absolute barrier height of the Schottky diode can be tailored. Furthermore, the variation of the Schottky barrier height among discrete Schottky diodes and junctions can be reduced which increases the yield of the manufacturing process.

The pre-treating of the semiconductor surface 111 includes subjecting the substrate surface 111 to a capacitively coupled plasma, particularly in an inert atmosphere. The power, which is capacitively coupled into the plasma during this treatment, can be in a range from 0 W to 80 W, in particular in a range between 5 W and 60 W, and more particularly in a range between 5 W and 40 W. Experiments confirmed that such surface treatment in plasma, which can be described as very light ion sputter processing (physical ion processing without a chemically reactive component, improves the quality of the Schottky barrier junctions and allows tuning of the Schottky barrier height. Furthermore, variations in the surface quality can be reduced which equalizes the barrier height of distinct Schottky diodes manufactured on the same wafer.

A second metallization 152, which forms a cathode metallization, can be formed on the second surface 112 and in ohmic contact with the semiconductor substrate 110.

Figure 9A:
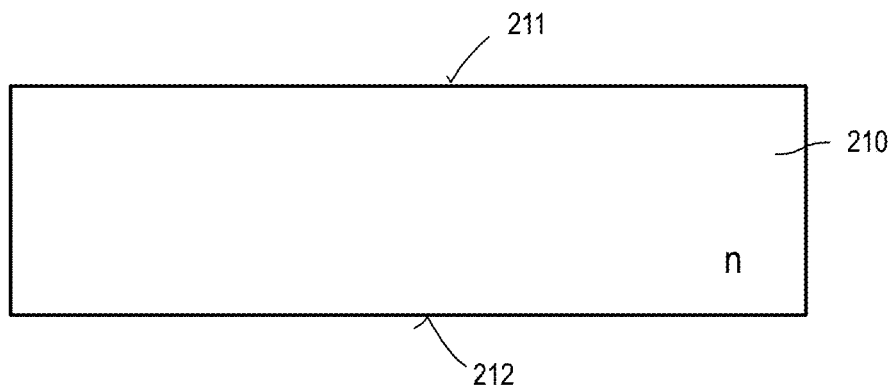
FIGS. 9A to 9C illustrate processes of a method for manufacturing a semiconductor device according to an embodiment.
Figure 9B:
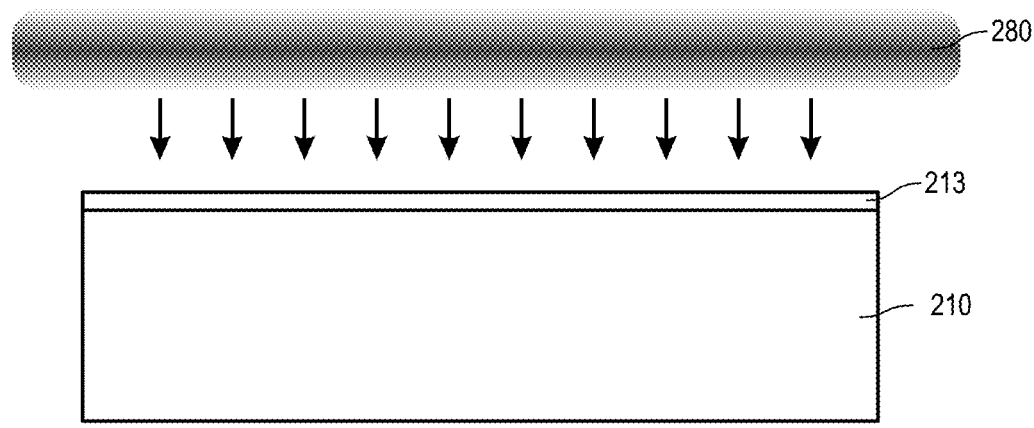
Figure 9C:
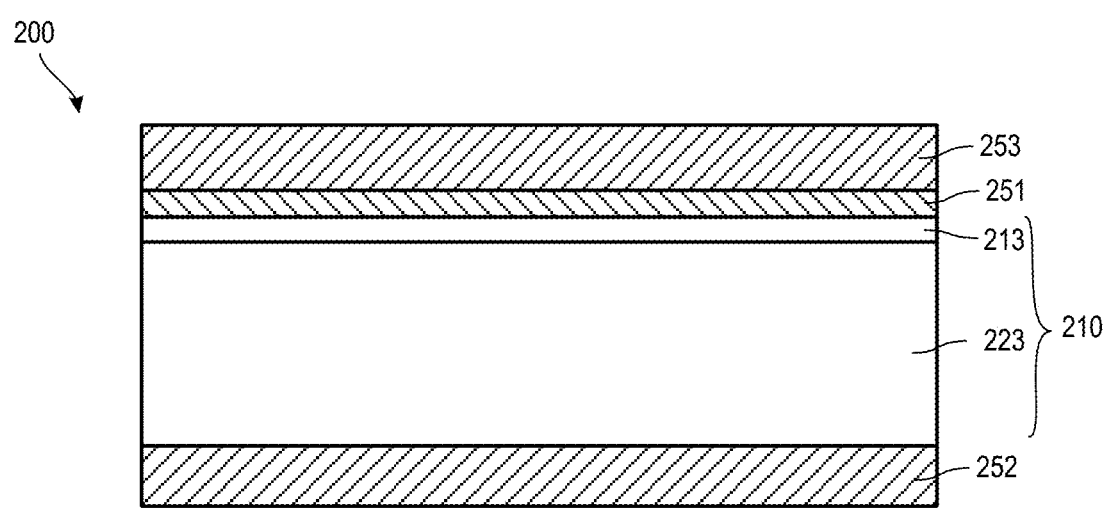

The Schottky contact can be, for example, formed by a method as illustrated in FIGS. 9A to 9C.

As illustrated in FIG. 9A, a semiconductor substrate 210 having a substrate surface or first surface 211 is provided. A second surface or side 212 of the semiconductor substrate 210 is arranged opposite the substrate surface 211.

In a further process, as illustrated in FIG. 9B, the semiconductor substrate 210 is pre-treated by subjecting the substrate surface 211 to a capacitively coupled plasma 280. The power, which is capacitively coupled into the plasma, can be, according to an embodiment, in a range from 0 W to 80 W. In a more specific embodiment, the power can be in a range between 5 W and 60 W, and more particularly in a range between 5 W and 40 W. The power coupled into the plasma is typically much lower than the power desired for sputter-etching.

The pre-treating of the substrate surface 211 results in the formation of defects that form an amorphous n-doped semiconductor surface layer 213.

The pre-treating process aims for introducing well-defined structural defects in the semiconductor substrate 210 close to the substrate surface 211, particularly in a range of few nanometers as described above. Although the pre-treating process may slightly etch the semiconductor substrate 210, it is, however, not needed to remove material from the semiconductor substrate 210. The main effect of the pre-treating is the formation of the thin amorphous semiconductor surface layer 213 as illustrated in FIG. 9B and described above. Even when the pre-treating would be carried out at very long process times, at which a partial removal of the semiconductor substrate 210 may occur, the formed amorphous semiconductor surface layer 213 would have the same thickness for a given power regardless of the sputter time.

For example, the total etch amount of the pre-treating process, as expressed in terms of $SiO_2$ equivalent removal, can be less than 10 nm, particularly less than 5 nm. The etching rate is typically expressed in terms of $SiO_2$ removal to allow comparison between different etching processes.

The pre-treating is carried out, according to an embodiment, in an inert atmosphere, for example in an argon atmosphere, without chemically reactive species. According to an embodiment, the pre-treating is carried out in a plasma essentially consisting of argon. Herein, "essentially consisting" means that only unavoidable impurities are present in the argon atmosphere.

The pre-treating, particularly carried out as in-situ sputtering, prior to the deposition of the Schottky-junction forming material introduces structural defects at well-defined density at the substrate surface. The layer region which includes theses defects is referred to as amorphous semiconductor surface layer 213. The structural defects, i.e. crystal defects, are also electrically active defects which pin the Fermi level at a given electrical location within the band gap of the semiconductor substrate 210. The Fermi level at the substrate surface 211 can therefore be reproducibly pinned to a predetermined value. The structural defects are long time stabile and are not significantly affected by following process steps.

When using SiC as semiconductor substrate 210, structural defects having an electrical location in the band gap can be formed. The defects can be, for example, in a range of 1 eV to 1.5 eV below the valance band of SiC.

The pinning of the Fermi level can be controlled by adjustment of process parameters such as the RF power (capacitively coupled power) coupled into the plasma discharge 280, the plasma density, the substrate bias, the plasma chamber pressure, and any combinations thereof. In particular, the defect density can be adjusted, for example, by varying the pressure during the plasma pre-treating. The geometrical depth of the defects can be adjusted, for example, by the power which is capacitively coupled into the plasma.

Due to the low power coupled into the plasma, only geometrically shallow defects are formed different to geometrically deep defects which are formed by higher plasma power. The pre-treating also does not implant impurities into the semiconductor substrate 210 but mainly forms structural defects which act as electrically active defects.

The pre-treating is in particular beneficial for compound semiconductors such as SiC which intrinsically have varying surface characteristics. The structural defects formed by the pre-treating forms the predominant surface defects so that other variations of the surface characteristics, which may influence the location of the Fermi level at the substrate surface, are less relevant. It is believed that the influence of the original surface characteristics on the barrier height of the Schottky contacts is comparably low in comparison to the influence of the structural defects introduced by the pre-treating. Therefore, when structural defects of a well-defined density and with high homogeneity are formed, the local variation of the Fermi level and thus of the barrier height can be reduced.

Furthermore, the absolute location of the Fermi level, which mainly defines the barrier height, can be tailored and varied in a well-defined and controllable manner. This allows the adjustment of the absolute barrier height of the Schottky contacts.

The pre-treating therefore allows the adjustment of the absolute barrier height as well as of the homogeneity of the barrier height.

The electrical location of the structural defects can be determined by DLTS (Deep-Level Transient Spectroscopy) which includes measurements of the capacity-voltage-dependency, so-called CV-measurements, to verify the presence of the amorphous semiconductor surface layer 213 due to the presence of the defects in the amorphous semiconductor surface layer 213.

According to an embodiment, the pre-treating of the semiconductor substrate 210 by subjecting the substrate surface 211 to a capacitively coupled plasma is carried out for less than 120 s, particularly less than 90 s. This sputter times has been evaluated as being sufficient for generating the amorphous semiconductor surface layer 213 that provides the desired defects. A longer sputter time would be in principle possible but does not further improve the generation of the defects. As indicated above, a longer sputter time may result in a slight removal of the semiconductor substrate 210 but does not lead, when keeping the sputter power constant, to a thicker amorphous semiconductor surface layer 213.

According to an embodiment, a pre-cleaning can be beneficially carried out prior to the pre-treating. Pre-cleaning the substrate surface 211 prior to pre-treating the semiconductor substrate 210 includes wet-chemical pre-cleaning, sputtering pre-cleaning, reactive sputtering pre-cleaning, and any combinations thereof. The main purpose of the pre-cleaning is the removal of contaminations.

According to an embodiment, the wet-chemical pre-cleaning includes cleaning the substrate surface 211 with a first cleaning solution comprising distilled water, $H_2O_2$ and ammonium hydroxide (RCA1/SC1) and/or with a second cleaning solution comprising distilled water, $H_2O_2$ and acid sulphur (RCA2/SC2). Such a wet-chemical pre-cleaning is beneficial for removing contaminations.

According to an embodiment, the sputtering pre-cleaning and/or the reactive sputtering pre-cleaning includes subjecting the substrate surface 211 to a capacitively coupled plasma at a power which is larger than the power for the pre-treating. The power for the sputtering pre-cleaning and/or the reactive sputtering pre-cleaning is at least 40 W, preferably at least 60 W, and more preferably at least 80 W.

When pre-cleaning the substrate surface 211 by plasma-etching, the capacitively coupled power is larger than for the pre-treating to obtain a sufficiently high etching rate. After pre-cleaning the substrate surface 211 by plasma-etching, the pre-treating can be carried out in the same plasma chamber without breaking the vacuum which is further beneficial in terms of avoidance of contaminations.

Wet-chemical pre-cleaning is particularly beneficial as it only removes the contaminations and saturates all dangling bonds at the surface with hydrogen atoms, i.e. the treated semiconductor surface is hydrophobic after the SC2 cleaning step. In contrast, sputter etch cleaning also removes part of the semiconductor and leads to surface roughening if the ratio of the etch rate of the semiconductor and the contaminant is comparable to or greater than 1.

In a further process, as illustrated in FIG. 9C, a Schottky-junction forming material 251 is sputtered onto the pre-treated substrate surface 211 to form a Schottky contact between the Schottky-junction forming material 251 and the semiconductor substrate 210. The Schottky-junction forming material 251 can be any of the above mentioned metals, metal nitrides or highly doped polysilicon. Molybdenum nitride is particularly promising for forming Schottky contact having a low barrier height. The sputtering also includes reactive sputtering of a metal in a nitrogen containing atmosphere to form the metal nitride.

According to an embodiment, sputtering of the Schottky-junction forming material 251 onto the pre-treated substrate surface 211 can therefore be performed in a nitrogen-containing atmosphere to form a metal nitride.

Different to other approaches, the Schottky-junction forming material 251 is sputtered and not formed by vapour deposition. Sputtering of the Schottky-junction forming material 251 in combination with the pre-treating, particularly immediately prior to the sputtering, yields Schottky contacts of highly reproducible barrier height and with low barrier height variation.

According to an embodiment, the processes of pre-treating the substrate surface 211 and sputtering the Schottky-junction forming material 251 onto the pre-treated substrate surface 211 are carried out in the same process chamber, particularly without breaking the vacuum.

According to an embodiment, at least one of the following processes are also carried out in the same process chamber: the process of pre-cleaning the substrate surface 211; sputtering the Schottky-junction forming material 251 onto the pre-treated substrate surface 211; and a process of forming a first metallization 253 onto the sputtered Schottky-junction forming material 251.

As illustrated in FIG. 9C, a second metallization 252 is formed on and in contact with the second surface 212 of the semiconductor substrate 210. The second metallization 252 forms the cathode metallization in this embodiment while the Schottky-junction forming material 251 together with the first metallization 253 forms the anode metallization. As a result, a Schottky diode is formed which represents a semiconductor device 200.

According to an embodiment, pre-treating of the semiconductor substrate 210 by subjecting the substrate surface 211 to a capacitively coupled plasma 280 can be carried out for less than 120 s at a pressure of less than 0.11 Pa (0.8 mTorr) and particularly between 0.0133 Pa (0.1 mTorr) and 0.11 Pa (0.8 mTorr). The pressure range has been proven to be beneficial for forming the desired defects. Furthermore, the time of 120 s is also sufficient although longer process times could be used.

According to an embodiment, a short processing time at low pressure is beneficial to reduce exposure to the plasma. In this case, the power coupled into the plasma could be at the upper end of the above indicated range.

Alternatively, a short processing time at low power can be used so that the pressure may be increased.

A further alternative is to conduct the pre-treating at low power and low pressure when a longer process time is desired.

A further embodiment is illustrated in FIGS. 10A to 10E. This embodiment illustrates the manufacturing process of MPS diodes.

Figure 10A:
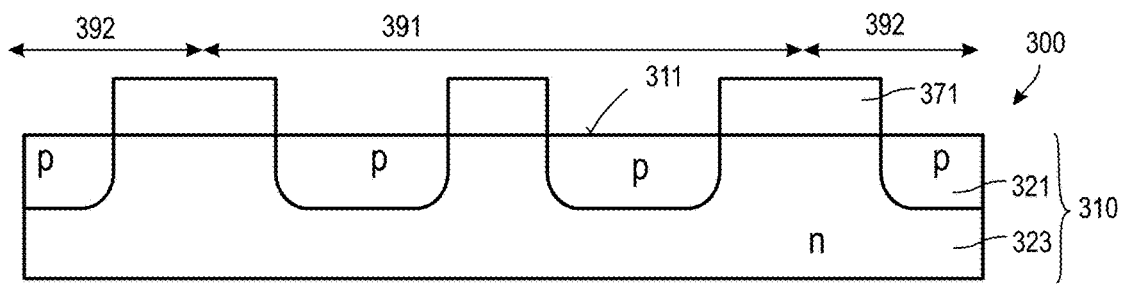
FIGS. 10A to 10E illustrate processes of a method for manufacturing a semiconductor device according to an embodiment.

As illustrated in FIG. 10A, a semiconductor substrate 310 is provided which includes at least one n-doped region 323 having exposed portions which are exposed at the substrate surface 311. The semiconductor substrate 310 can further optionally include at least one p-doped region 321 having an exposed portion which is exposed at the substrate surface 311.

The semiconductor substrate 310 further includes an active area 391 and a peripheral area 392 which is also referred to as edge termination area. The p-doped regions 321 are formed in the active area 391, which forms there pn-junctions surrounded by Schottky-junctions which are formed subsequently. The p-doped regions 321 in the peripheral area 392 function, for example, as guard rings.

The p-doped regions 321 are formed by implantation using an implantation mask 371, as illustrated in FIG. 10A, followed by high temperature annealing.

Figure 10B:
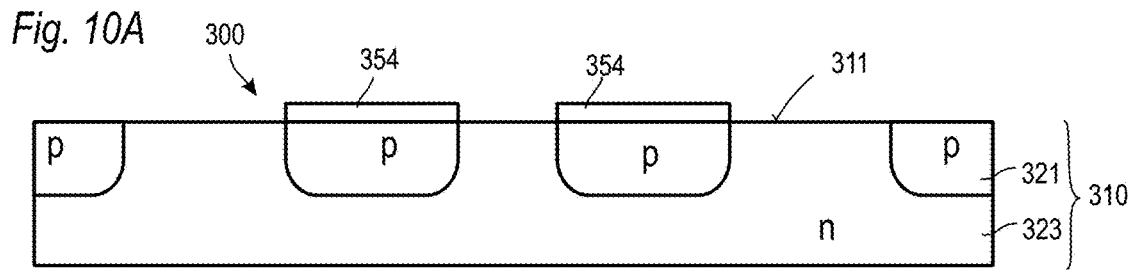

In a further process, as illustrated in FIG. 10B, a contact metallization 354 is formed on the p-doped regions 321, particularly in the active area 391. A contact metallization can also be formed on the p-doped regions 321 in the peripheral area 392 if desired.

Figure 10C:
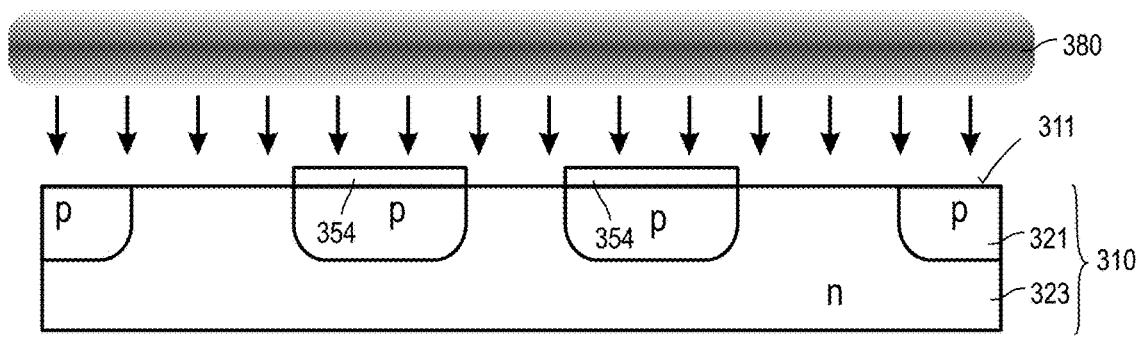

In a further process, as illustrated in FIG. 10C, the substrate surface 311 is subjected to a pre-cleaning and subsequently to a pre-treating as described above in detail. Particularly at least the exposed portions of the n-doped region 323 are pre-treated by subjecting the substrate surface 311 to the capacitively coupled plasma 380.

Figure 10D:
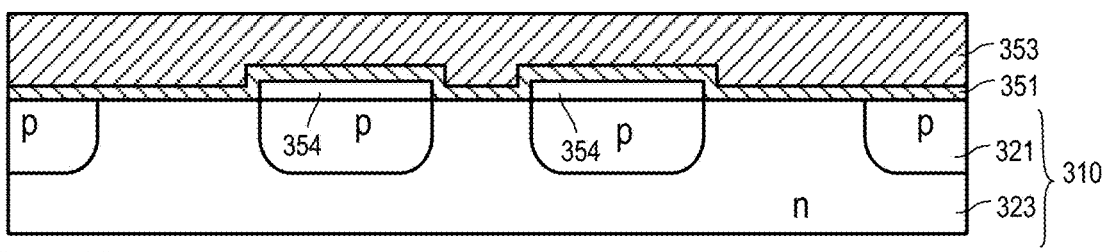

In a further process, as illustrated in FIG. 10D, the Schottky-junction forming material 351 is sputtered to be in direct contact with the exposed portions of the n-doped region 323. Subsequently, the first metallization 353 is deposited, for example by sputtering. The pre-treating, the sputtering of the Schottky-junction forming material 351, and the sputtering of the first metallization 353 can be carried out in the same plasma chamber, particularly without any intermediate vacuum break.

Figure 10E:
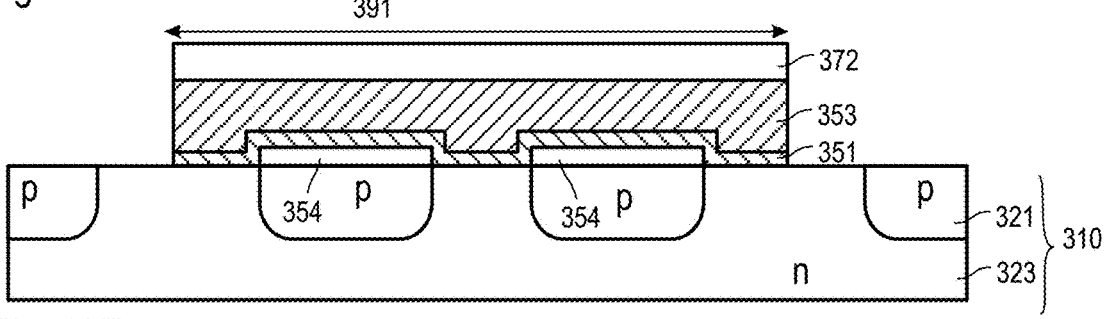

The Schottky-junction forming material 351 and the first metallization 353 are subsequently wet-chemically etched using an etch mask 372 as illustrated in FIG. 10E. The Schottky-junction forming material 351 and the first metallization 353 form together the anode metallization within the active area 391, which anode metallization is in ohmic contact with the exposed portions of the n-doped region 323 and the contact metallization 354 and thus with the p-doped regions 321.

In further processes, the second metallization is formed on and in ohmic contact with the second surface of the semiconductor substrate. Furthermore, the peripheral area 392 is passivated by covering the peripheral area 392 in a passivation material.

The contact metallization 354 is optional and could be omitted. When the contact metallization 354 is omitted, the Schottky junction forming material 351 is in direct contact with the p-doped regions 321.

The effects of the above described pre-treating on the Schottky barrier height have been confirmed experimentally. Experimental results are illustrated in FIGS. 3 to 8.

Figure 2:
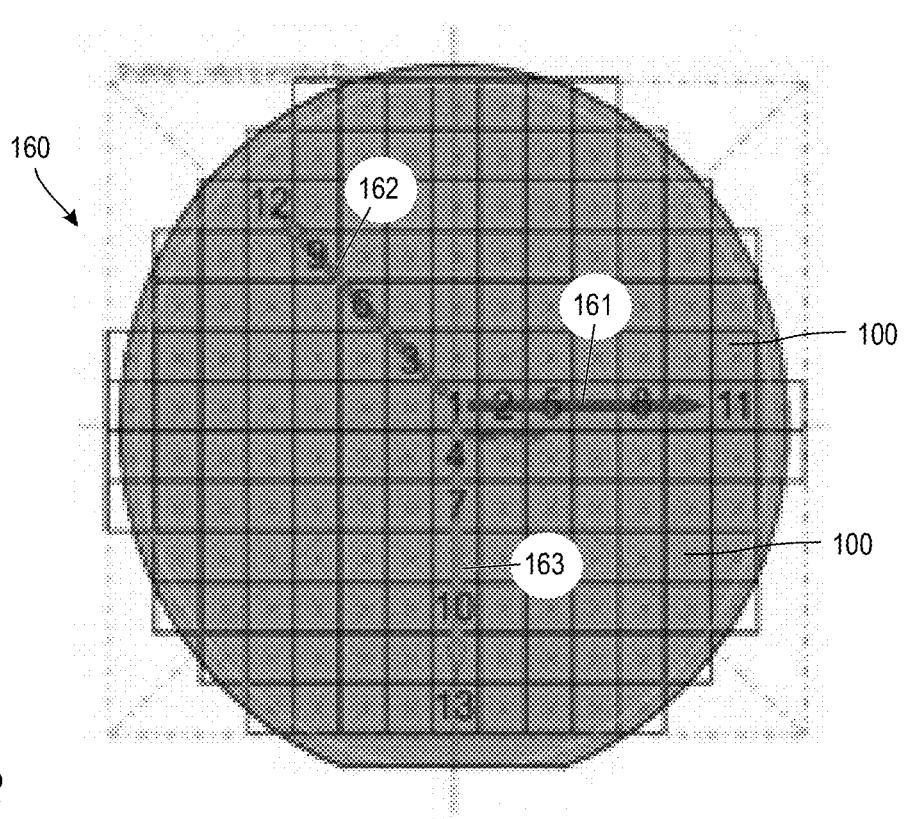
FIG. 2 illustrates the location of measuring points on a semiconductor wafer.

The experimental results have been obtained using a 4 inch SiC wafer 160 as illustrated in FIG. 2. A plurality of discrete Schottky diodes 100 has been integrated in the wafer 160. Individual measurements of the Schottky barrier height at different locations have been made along three different lines 161, 162, 163 as illustrated in FIG. 2. The location for each individual measurement is indicated by numbers.

FIGS. 3 to 6 illustrates the variation of the Schottky barrier height at the different locations for a titanium Schottky contact. The variation, i.e. the range between the maximum and minimum measured Schottky barrier height is indicated in each Figure. FIGS. 3 to 6 have the same scaling.

Figure 3:
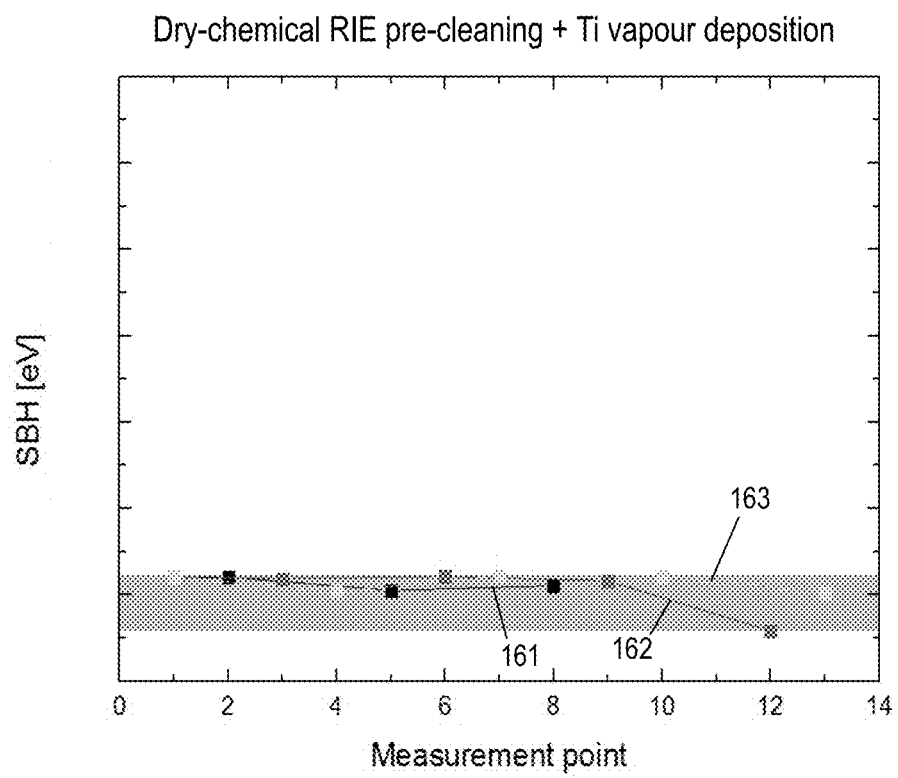
FIG. 3 illustrates measuring results of the Schottky barrier height at different locations on a semiconductor wafer processed according to an comparison process.

FIG. 3 shows the measurement results for a comparison experiment using a dry-chemical RIE process that employs a reactive plasma etching using $CF_4$ and $O_2$ in an argon atmosphere. The above described pre-treating is different to this dry-chemical RIE process as the above described pre-treating is mainly, according to an embodiment, a treatment in an argon atmosphere, or generally in an inert atmosphere, without any reactive chemical component. Titanium is then vapour deposited onto the dry-chemically processed wafer surface.

As it becomes apparent from FIG. 3, the combination of a dry-chemical RIE process and a vapour deposition shows a medium barrier height variation over the wafer 160.

Figure 4:
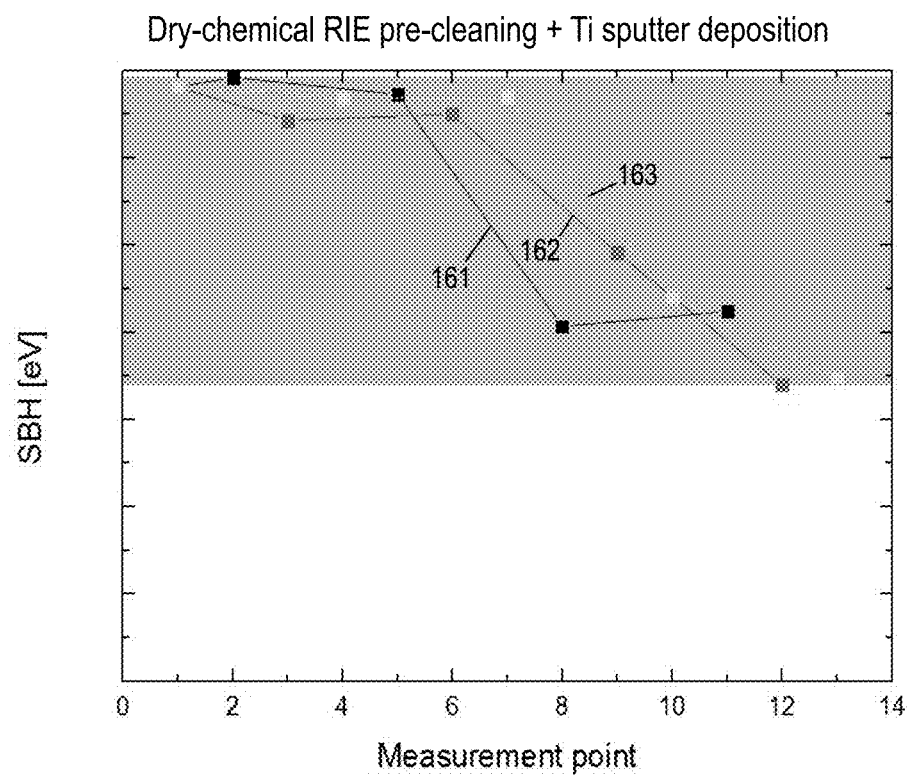
FIG. 4 illustrates measuring results of the Schottky barrier height at different locations on a semiconductor wafer processed according to an comparison process.

FIG. 4 shows the measurement results of a comparison experiment with titanium sputtering after a dry-chemical RIE process. The variation of the Schottky barrier height is very large indicating that the common dry-chemical RIE process without the pre-treating as described herein does not provide satisfactory results in terms of barrier height variation.

Figure 5:
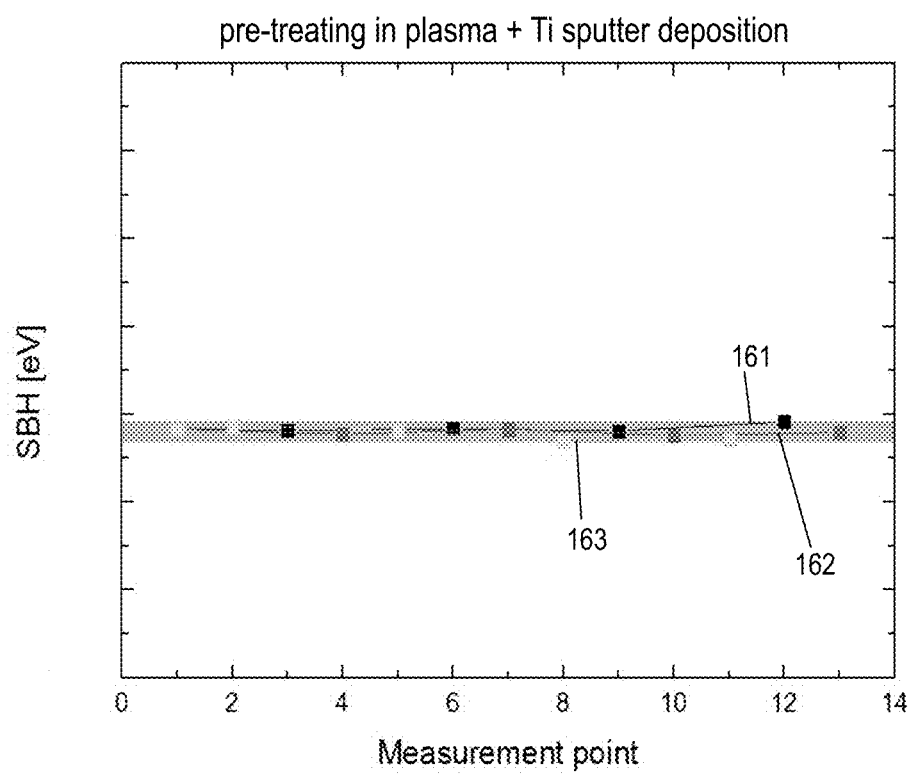
FIG. 5 illustrates measuring results of the Schottky barrier height at different locations on a semiconductor wafer processed according to an embodiment.

FIG. 5 shows the measurement results of an example according to an embodiment using pre-treating followed by sputtering of titanium. The variation of the absolute barrier height is very low which indicates that the pre-treating leads to homogeneous surface characteristics which are beneficial for homogeneous Schottky contacts. Basically the same Schottky barrier height was obtainable for central as well as for peripheral regions of the wafer 160.

Figure 6:
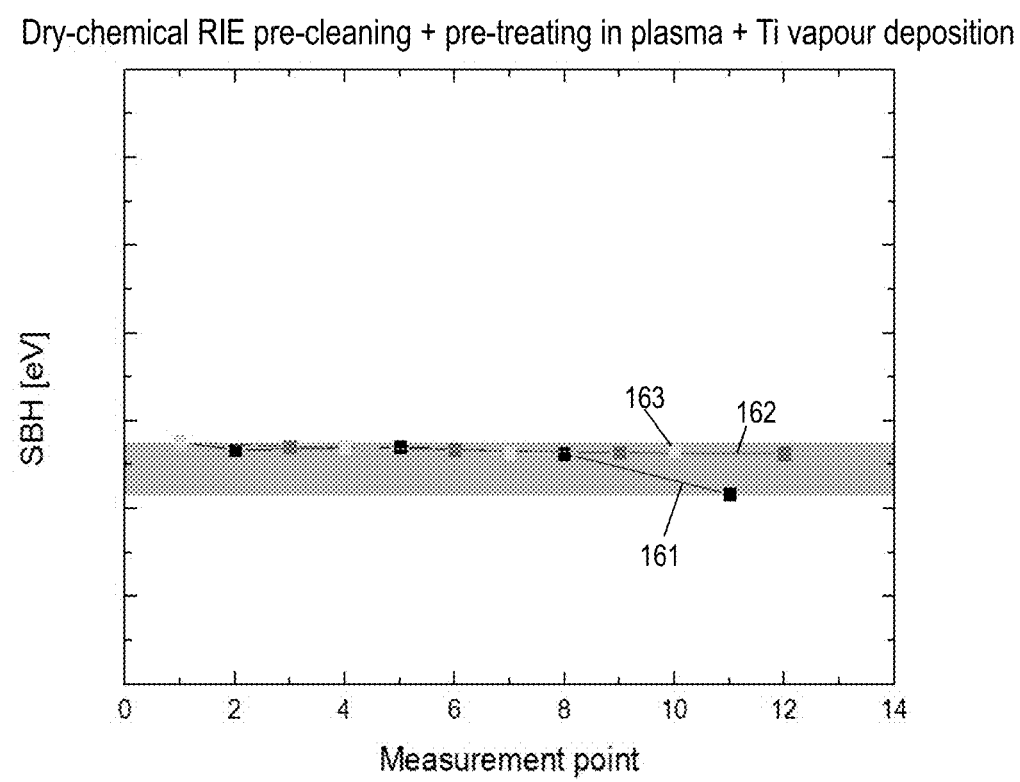
FIG. 6 illustrates measuring results of the Schottky barrier height at different locations on a semiconductor wafer processed according to an embodiment.

FIG. 6 shows the measurement results of an example according to an embodiment which additionally employs a dry-chemical RIE process prior to the pre-treating. Titanium is then sputtered.

As revealed by comparison of FIG. 6 with FIG. 4, the additional pre-treating significantly reduces the large variation of the Schottky barrier height as it was observed in FIG. 4 which does not employ the pre-treating. Furthermore, the medium absolute Schottky barrier height is also lowered.

The experimental results are also summarised in the following table 1 which gives an overview of the average Schottky barrier height (SBH) in eV, the standard deviation σ (in eV) of the Schottky barrier height, and the difference (delta Δ in eV) of the average Schottky barrier height from the theoretical value.

TABLE 1

|  | FIG. 3 | FIG. 4 | FIG. 5 | FIG. 6 |
| --- | --- | --- | --- | --- |
| average SBH [ev] | 0.8-2 | 0.8-2 | 0.8-2 | 0.8-2 |
| σ [eV] | <0.005 | 0.01-0.1 | <0.005 | <0.005 |
| Δ [eV] | <0.02 | 0.02-0.5 | <0.02 | <0.02 |

The results of FIGS. 5 and 6 show that the variation of the Schottky barrier height over the wafer can be significantly reduced when using the pre-treating in plasma at low power together with sputtering of the Schottky-junction forming material after the pre-treating. The variation or homogeneity, as expressed in terms of the standard deviation a, can be significantly reduced in comparison to the case of a dry-chemical RIE process followed by sputter deposition, by a factor of more than 20. The very homogeneous Schottky barrier height significantly increases the yield and improves the device characteristics as they are tailored within a narrow range.

Figure 7:
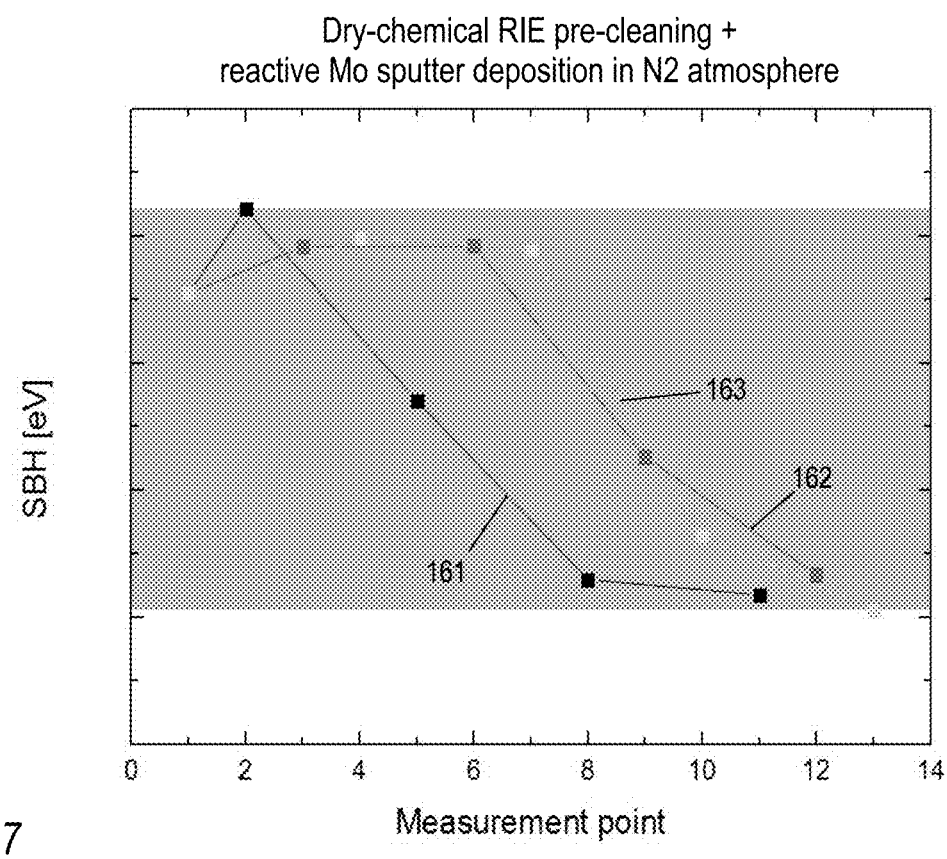
FIG. 7 illustrates measuring results of the Schottky barrier height at different locations on a semiconductor wafer processed according to an comparison process.
Figure 8:
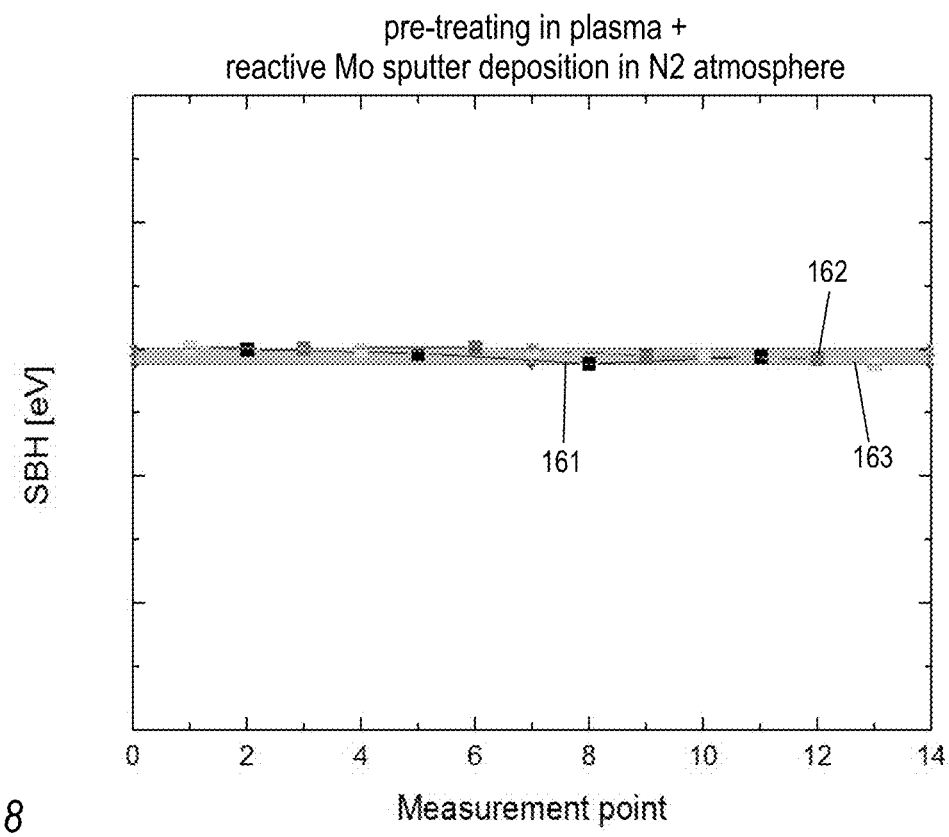
FIG. 8 illustrates measuring results of the Schottky barrier height at different locations on a semiconductor wafer processed according to an embodiment.

FIGS. 7 and 8 illustrate measurement results for a comparison experiment (FIG. 7) and an experiment according to an embodiment (FIG. 8). FIGS. 7 and 8 have the same scaling. The comparison experiment of FIG. 7 includes a dry-chemical RIE process followed by reactive sputter deposition of molybdenum in an atmosphere with 40% nitrogen to deposit molybdenum nitride as Schottky-junction forming material. More specifically, the partial pressure of nitrogen was 40% of the total gas pressure. The remaining gas was argon. The reactive sputter deposition was carried out at about 0.8 Pa (6 mTorr). The experiment of FIG. 8, which is an experiment according to an embodiment, employed the pre-treating prior to the reactive sputter deposition of molybdenum. The reactive sputter deposition of FIG. 8 was carried out in an atmosphere with 30% nitrogen (the partial pressure of nitrogen was 30% of the total gas pressure, with the remaining gas being argon) to deposit molybdenum nitride as Schottky-junction forming material.

The experimental results are also summarised in the following table 2 which gives an overview of the average Schottky barrier height (SBH) in eV, the standard deviation σ (in eV) of the Schottky barrier height, and the difference (delta Δ in eV) of the average Schottky barrier height from the theoretical value.

TABLE 2

|  | FIG. 7 | FIG. 8 |
| --- | --- | --- |
| average SBH [ev] | <1 | <1 |
| σ [eV] | <0.1 | <0.005 |
| Δ [eV] | <0.2 | <0.01 |

The results of FIGS. 7 and 8 show that the variation of the Schottky barrier height, as expressed by the standard deviation σ, can be significantly reduced by a factor of at least 20. Furthermore, the delta Δ can be reduced by a factor of 20.

In the above experiments, a DC magnetron equipment was used and the DC Bias was set appropriately. The capacitively coupled power was 34 W. The pre-treating can be applied to various wafer sizes including wafers of 6 inch (15 cm) and more.

In view of the above, a semiconductor wafer is provided, according to an embodiment, which includes an n-doped semiconductor wafer having a wafer surface, and a plurality of Schottky contacts formed at the wafer surface. Each of the Schottky contacts has a Schottky barrier height. The standard variation of the Schottky barrier heights of the Schottky contacts is less than 5%, particularly less than 2%, and more particularly less than 1% of the arithmetically mean (average) Schottky barrier height of the Schottky barrier heights of the plurality of the Schottky contacts.

The influence of the process time is comparably small. It is believed, without wishing to be bound, that the structural defects are formed within a comparably short time and that a longer pre-treating does not significantly increases the density of the structural defects. Hence, the pre-treating can be limited to a short duration which is beneficial from an economical point of view.

Different to the process time, the power has a significant influence on the absolute Schottky barrier height but only a small influence on the homogeneity. It is therefore possible to adjust the absolute Schottky barrier height by varying the power of the pre-treating without influencing the homogeneity.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device having at least one Schottky contact, the method comprising: providing a semiconductor substrate having a substrate surface; pre-treating the semiconductor substrate by subjecting the substrate surface to a capacitively coupled plasma, wherein power which is capacitively coupled into the plasma is in a range from 0 W to 80 W; wherein the capacitively coupled plasma is carried out for less than 120 s; and sputtering a Schottky-junction forming material directly on the pre-treated substrate surface to form a Schottky contact that forms a Schottky barrier at an interface between the Schottky-junction forming material and the semiconductor substrate.

2. The method of claim 1, wherein the Schottky-junction forming material is selected from the group consisting of molybdenum, molybdenum nitride, titanium, titanium nitride, tantalum, tantalum nitride, tungsten, tungsten nitride, polysilicon having a doping concentration of at least $10^{17}/cm^3$, and any combination thereof.

3. The method of claim 1, further comprising pre-cleaning the substrate surface prior to pre-treating the semiconductor substrate, wherein the pre-cleaning comprises wet-chemical pre-cleaning, sputtering pre-cleaning, reactive sputtering pre-cleaning, or any combination thereof.

4. The method of claim 3, wherein the wet-chemical pre-cleaning comprises cleaning the substrate surface with a first cleaning solution comprising distilled water, $H_2O_2$ and ammonium hydroxide and/or with a second cleaning solution comprising distilled water, $H_2O_2$ and hydrochloric acid.

5. The method of claim 3, wherein the sputtering pre-cleaning and/or the reactive sputtering pre-cleaning comprises subjecting the substrate surface to a capacitively coupled plasma at a power which is larger than the power for the pre-treating, wherein the power for the sputtering pre-cleaning and/or the reactive sputtering pre-cleaning is at least 40 W.

6. The method of claim 1, wherein the pre-treating of the substrate surface results in formation of an amorphous n-doped semiconductor surface layer.

7. The method of claim 6, further comprising determining a presence and a thickness of the amorphous n-doped semiconductor surface layer using a focused ion beam cut in combination with scanning electron microscope analyses.

8. The method of claim 1, wherein the pre-treating of the substrate surface is carried out such that the Fermi level at the substrate surface is pinned to a predetermined value.

9. The method of claim 1, wherein the processes of pre-treating the substrate surface and sputtering the Schottky-junction forming material onto the pre-treated substrate surface are carried out in the same process chamber.

10. The method of claim 9, wherein at least one of the following processes are also carried out in the same process chamber:
pre-cleaning the substrate surface;
sputtering the Schottky-junction forming material onto the pre-treated substrate surface; and
forming a metallization on the sputtered Schottky-junction forming material.

11. The method of claim 1, wherein the Schottky-junction forming material is sputtered onto the pre-treated substrate surface in a nitrogen-containing atmosphere.

12. The method of claim 1, wherein the semiconductor substrate comprises an n-doped region comprising an exposed portion which is exposed at the substrate surface, wherein the exposed portion of the n-doped region is pre-treated by subjecting the substrate surface to the capacitively coupled plasma, and wherein the Schottky-junction forming material is in direct contact with the exposed portion of the n-doped region.

13. The method of claim 1, further comprising adjusting a defect density of the semiconductor substrate by varying an ambient pressure during the pre-treating step.

14. The method of claim 1, further comprising adjusting a geometrical depth of defects in the semiconductor substrate by adjusting the power which is capacitively coupled into the plasma.

15. The method of claim 1, wherein the pre-treating of the semiconductor substrate partially etches the semiconductor substrate, wherein a total etching is less than 10 nm of $SiO_2$ equivalent removal.

16. A method for manufacturing a semiconductor device having at least one Schottky contact, the method comprising:
providing a semiconductor substrate having a substrate surface;
pre-treating the semiconductor substrate by subjecting the substrate surface to a capacitively coupled plasma for less than 120 s at a pressure of less than 0.11 Pa (0.8 mTorr); and
sputtering a Schottky-junction forming material directly onto the pre-treated substrate surface to form a Schottky contact that forms a Schottky barrier at an interface between the Schottky-junction forming material and the pre-treated substrate surface.

17. The method of claim 16, wherein the semiconductor substrate comprises SiC, Si, SiGe, GaAs, GaN, AlGaAs, GaInP, III-V compound semiconductors such as GaAsP, (III,III)-V compound semiconductors, III-(V,V) compound semiconductors, or diamond.

18. The method of claim 16, wherein pre-treating the semiconductor substrate comprises subjecting the substrate surface to an argon plasma discharge, wherein power which is capacitively coupled into the plasma is in a range from 0 W to 80 W.

\* \* \* \* \*